United States Patent [19]
Park et al.

[11] Patent Number: 5,386,645
[45] Date of Patent: Feb. 7, 1995

[54] ROTARY-TYPE WAFER DRYING APPARATUS WITH ANTI-DEFLECTION COVER

[75] Inventors: Dae I. Park; Weon G. Kim; Sang H. Park; Hee C. Son, all of Kyoungki-do, Rep. of Korea

[73] Assignee: Hyundai Electronics Industries Co., Ltd., Kyoungki-do, Rep. of Korea

[21] Appl. No.: 113,013

[22] Filed: Aug. 30, 1993

[30] Foreign Application Priority Data

Aug. 31, 1992 [KR] Rep. of Korea .................. 92-16444

[51] Int. Cl.$^6$ ............................................... F26B 5/08
[52] U.S. Cl. ..................................... 34/317; 34/312; 34/186
[58] Field of Search ............... 34/8, 58, 59, 184, 185, 34/186, 312, 317, 318; 134/17, 33

[56] References Cited

U.S. PATENT DOCUMENTS

| | | | |
|---|---|---|---|
| 3,824,701 | 7/1974 | Norquist | 34/58 |
| 4,445,281 | 5/1984 | Aigoo | 34/58 |
| 4,489,501 | 12/1984 | Aigo | 34/58 |
| 4,489,502 | 12/1984 | Aigo | 34/58 |
| 4,848,006 | 7/1989 | Seiichiro | 34/58 |

*Primary Examiner*—Denise L. Gromada
*Attorney, Agent, or Firm*—Lowe, Price, LeBlanc & Becker

[57] ABSTRACT

A rotary-type wafer drying apparatus includes a deflection prevention protecting plate attached to a cradle for a wafer, for diminishing rebounding of dewaterized water. A free side of the protecting plate in the cradle containing wafer maintains an appropriate angle with the cradle and the transverse length of the plate is longer than the transverse length of the radially outward side of the cradle.

4 Claims, 2 Drawing Sheets

ROTARY-TYPE WAFER DRYING APPARATUS WITH ANTI-DEFLECTION COVER

BACKGROUND OF THE INVENTION

1. Field of the Invention

This invention relates to a rotary-type wafer drying apparatus incorporated in semiconductor manufacturing process to prevent the contamination of a wafer, and more particularly to a wafer drying apparatus with an anti-deflection cover for protecting the rebounding of deionized water to the wafer being dried in the drying apparatus, said protecting plate mounted to a cradle containing the wafer to be dried. As is well known, cleaning of a wafer is typically carried out by spraying deionized water on the wafer. The deionized water present on the wafer is then removed by applying rotational force to the wafer.

2. Description of the Prior Art

The wafer drying apparatus of the prior art, as illustrated in FIG. 1, is comprised of a rotor 4 rotating around shaft 5, and a plurality of cradles 2 mounted to the inside of the rotor for carrying the wafer 1 being processed. The deionized water which is on the wafer is removed by centrifugal force applied by rotor 4, and thus drying of wafer is carried out.

However, in the apparatus of prior art, if the rotor is at a high speed deionized water coming off the wafer collides with the cylinder wall 3 of the drying apparatus and rebounds against the wafer, thereby re-contaminating the wafer.

To cope with this, as illustrated in FIG. 2, the cylindrical wall 3 is equipped with a rugged surface so as to lessen the reflection phenomenon that water buried in wafer is rebounded from the wall. Nonetheless, the rugged-shaping of the equipment cannot completely overcome the reflection of removed water since the rebound phenomenon still recurs. Furthermore, in case of incorporating such rugged-shaping and others into the cylinder wall 3 of the drying apparatus, set-up expenses are very high and it is very difficult to operate the apparatus.

SUMMARY OF THE INVENTION

In order to overcome the aforementioned defects, it is a principle object of the present invention, therefore, to provide a rotary type wafer drying apparatus which comprises a protective cover mounted to the cradle of wafer drying apparatus so that when the drying apparatus is at high speed, deionized water slides down along the protecting plate before it arrives at the cylindrical wall, thus preventing the reflection phenomenon in cylindrical wall.

It is another object of the present invention to obtain higher yield rate and better quality through the complete drying of the wafer and to make the processing of high-performance wafer possible, since such process is indispensable to the processing of a more integrated wafer.

To make the description more clear, reference is made to the accompanying drawings below.

DETAILED DESCRIPTION OF THE PREFERRED EMBODIMENT

Figure 1:
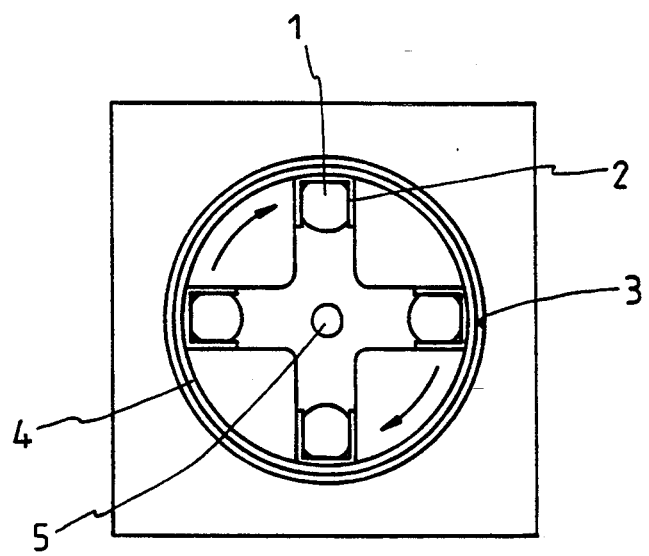
FIG. 1 is a schematic top view of rotary type wafer drying apparatus according to the prior art.
Figure 2:
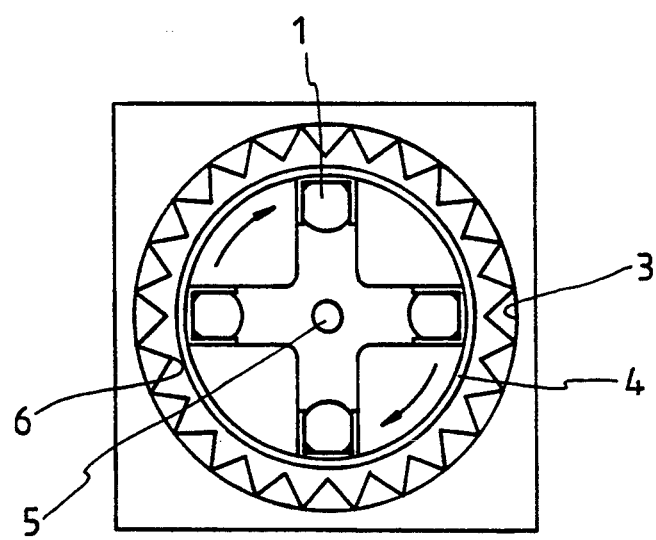
FIG. 2 is a schematic top view of another wafer drying apparatus which is equipped with rugged anti-deflection device in the cylinder according to the prior art.
Figure 3:
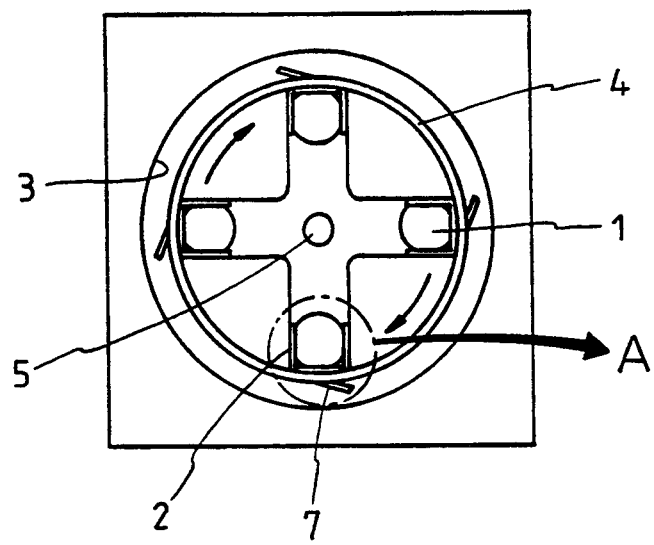
FIG. 3 is a schematic top view of wafer drying apparatus according to the preferred embodiment of the present invention.

FIG. 3 is a schematic top view of rotary type wafer drying apparatus according to the preferred embodiment of the invention where a protecting plate 7 is mounted on the cradle 2 in accordance with the present invention.

Figure 4:
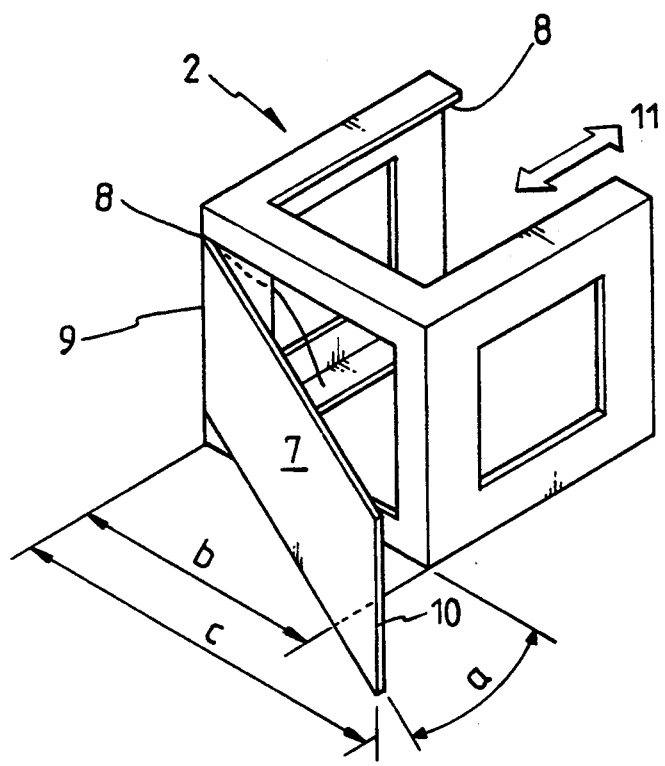
FIG. 4 is an enlarged perspective view of cradle and protecting plate shown in part 'A' of FIG. 3.

FIG. 4 is a perspective view showing details of cradle 2 and of the protecting plate 7 from part 'A' of FIG. 3.

The core of the reflection-prevention apparatus is as follows:

As shown in FIGS. 3 and 4, a wafer carrier (not illustrated in the drawings) which contains wafer (1) slides in and out of the cradle (2) in the direction (11) and is supported by a wafer carrier supporter (8).

The protection panel (7) is maintained at an angle a in the appropriate range of 5 to 15 degrees when compared with cradle (2).

The length (c) of a protection panel which is parallel to one side of cradle is longer than the length (b) of the one side of cradle (2) and one perpendicular side of the protection panel is attached to one side of the cradle rotated by roter (4), and is specifically and fixed to a conjunction section (9) thereof.

The drying apparatus provided with protecting plate (7) for deflection-prevention of the present invention shows that at high-speed rotation, deionized water buried in the wafer collides with the protecting plate (7) by centrifugal force. Hence, since it is impossible for removed water droplets to be deflected from protecting plate (7) by their own kinetic energies, they are buried in protecting plate (7).

In the inside wall of protecting plate (7) between the point conjunction section (9) of cradle (2) and the other side (10) of protection panel (7), the removed deionized water attached to the protection panel (7) slides down the wall through air resistance and certifugal force and is removed to outside the wall.

Though the deionized water sliding from the wall may be deflected by the wall, such water will be prevented from contaminating the wafer by the protection panel (7).

As described above, the wafer-rotary drying device equipped with a protecting plate for deflection-prevention attached to a cradle which contains the wafer, may prevent contamination of the wafer by inhibiting the rebounding phenomenon of water that is removed from the cylinder wall at high rotational speed.

While the present invention has been set forth in connection with the preferred embodiment of the invention, various changes, modifications and alterations can be made by those who have ordinary skill in the art. Therefore, the above description should not be taken as limiting the scope of the invention which is defined by the appended claims.

What is claimed is:

1. A rotary-type wafer drying apparatus used in a manufacturing process of semiconductors and having a rotor rotating around a shaft, a plurality of cradles mounted to an inner portion of said rotor for conveying a wafer being dried, each cradle including at least first and second longitudinal sides, and a cylinder surrounding the plurality of cradles and the rotor for protecting the cradles and rotor from the ambient atmosphere, further comprising a protecting plate mounted to one longitudinal side of an outer surface of the cradle, said protecting plate extending beyond an opposing longitudinal side of the cradle, a free end of said protecting plate being spaced apart from the opposing longitudinal side of the cradle to provide a passage between an inner surface of said protecting plate and the outer surface of the opposing longitudinal side of the cradle, said protecting plate being mounted to the cradle for rotation together with the cradle when said rotor is rotated to perform the drying process.

2. A rotary-type wafer drying apparatus as recited in claim 1, wherein said passage formed between said inner surface of said protecting plate and the opposing longitudinal side of the cradle is opened in a direction opposite to a direction of rotation of the cradle and rotor.

3. A rotary-type wafer drying apparatus as recited in claim 2, wherein said protecting plate is inclined to the outer surface of the cradle at an angle in a range between 5 degrees and 15 degrees.

4. A rotary-type wafer drying apparatus as recited in claim 1, wherein said protecting plate is inclined to the outer surface of the cradle at an angle in a range between 5 degrees and 15 degrees.

* * * * *